United States Patent [19]

Moeller

[11] 4,223,174
[45] Sep. 16, 1980

[54] SUN-TRACKING SOLAR ENERGY CONVERSION SYSTEM

[75] Inventor: Douglas E. Moeller, Lincolnshire, Ill.

[73] Assignee: Sun Trac Corporation, Glenview, Ill.

[21] Appl. No.: 706,748

[22] Filed: Jul. 19, 1976

[51] Int. Cl.$^2$ .................. H01L 31/04; G01J 1/20; G02B 5/10

[52] U.S. Cl. .................. 136/246; 126/425; 250/203 R; 350/320

[58] Field of Search .......... 250/203, 237, 239; 350/293, 294, 319, 320; 318/480; 126/270, 322/2; 310/4 R; 320/30, 61, 2; 136/89 PC

[56] References Cited

U.S. PATENT DOCUMENTS

| | | | |
|---|---|---|---|
| 3,317,809 | 5/1967 | Bowers et al. | 320/30 |
| 3,486,026 | 12/1969 | Bez | 250/203 R X |
| 3,899,672 | 8/1975 | Levi-Setti | 350/293 |
| 3,996,917 | 12/1976 | Trihey | 126/270 |
| 4,023,368 | 5/1977 | Kelly | 250/203 R X |
| 4,046,462 | 9/1977 | Fletcher et al. | 350/320 X |
| 4,055,161 | 10/1977 | Jones | 126/170 X |
| 4,080,221 | 3/1978 | Manelas | 136/89 PC |

*Primary Examiner*—Robert J. Hickey
*Attorney, Agent, or Firm*—Emrich, Root, O'Keefe & Lee

[57] ABSTRACT

A number of solar energy converter assemblies are carried by a support frame which is mounted for independent rotation about a horizontal and a vertical axis. Sensors detect the position of the sun; and control circuitry positions the support frame in elevation and azimuth so that the converter assemblies track and face the sun whenever the sun incident energy is greater than a threshold level of about 25 percent of normal. Each converter assembly includes a solar cell and a multiangular conical concentrator shell for collecting, concentrating and directing incident solar energy onto the solar cell. The converter assemblies, the support frame and its mount, and the drive mechanism for the support frame are all located within a transparent stationary housing or enclosure, which provides complete environmental protection for all elements mounted within the enclosure.

9 Claims, 9 Drawing Figures

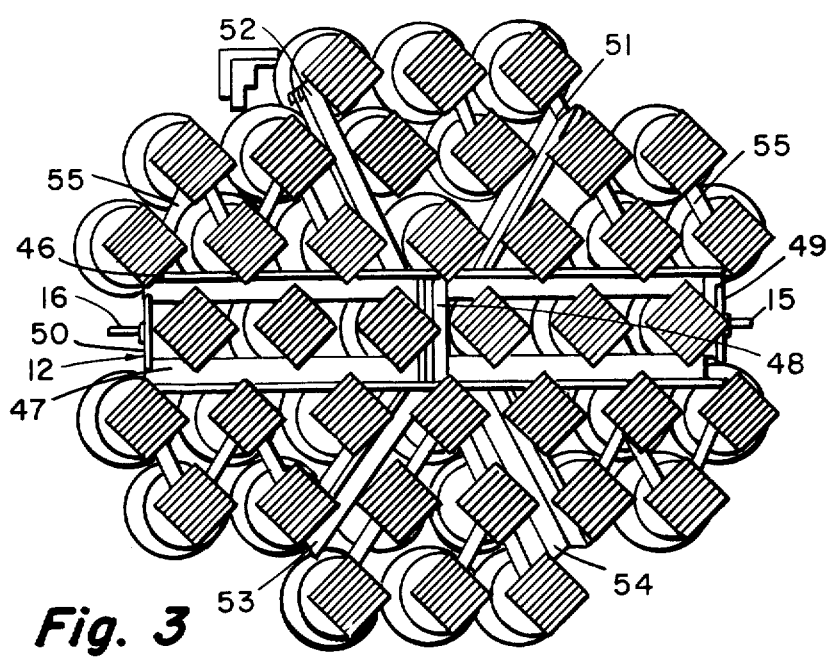
Fig. 3
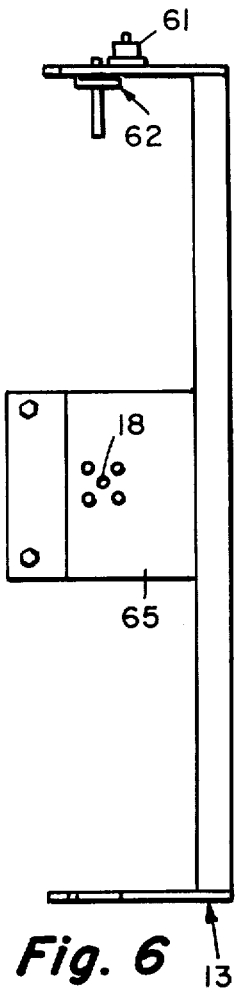
Fig. 6
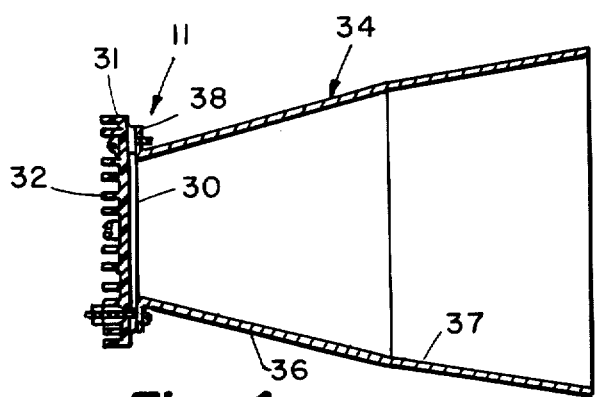
Fig. 4
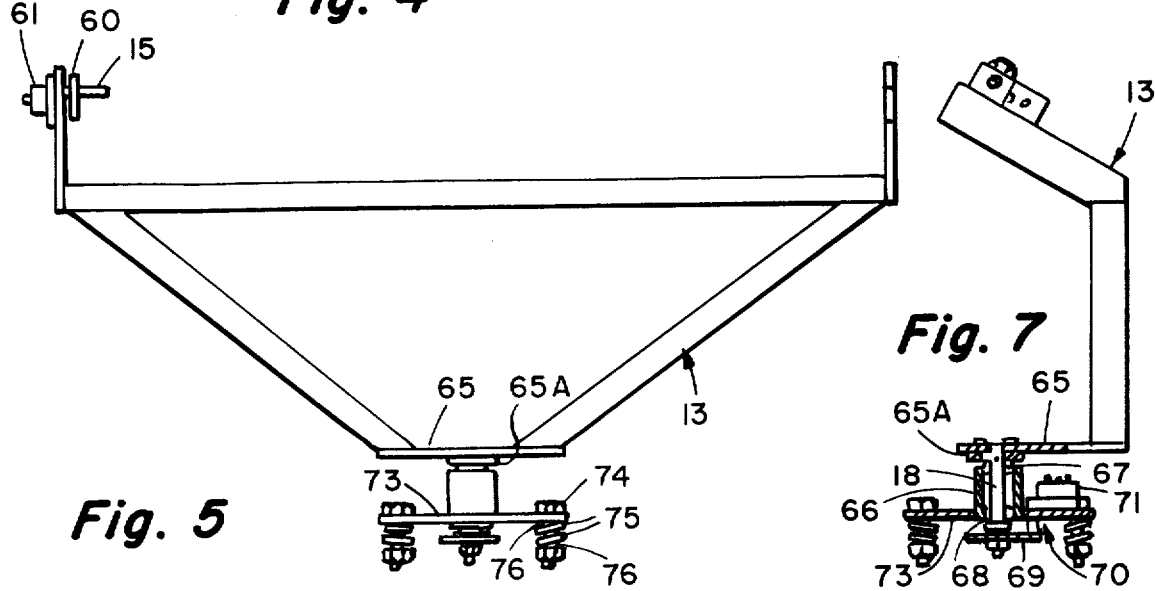
Fig. 5
Fig. 7

SUN-TRACKING SOLAR ENERGY CONVERSION SYSTEM

BACKGROUND AND SUMMARY

The present invention relates to self-sufficient power stations; and more particularly, it relates to a remote power station for converting solar energy to a more useful form of energy, such as electricity or heat.

Systems of the type with which the present invention is concerned have principal application in remote areas where electricity or other utilities are not readily available. In a broader sense, however, persons skilled in the art will readily appreciate that the present invention is more broadly directed to a solar energy conversion system, whether the useful energy is in the form of electricity or heat, and irrespective of its ultimate use. Even though the invention has such broader application, it will be disclosed in the context of a remote source of electrical power such as is used, for example, for cathodic corrosion protection of subterranean metal pipes. Such systems are used in the oil and gas industries, in both drilling and distribution or storage systems.

In cathodic corrosion protection applications, a dc electrical current is continuously generated between a ground bed "sacrificial" electrode (which is the anode or positive terminal) and the metal pipes to be protected (which forms the cathode or negative terminal). The magnitude of the required current is determined by the size of the system being protected and the impedance characteristics of the ground, called the "ground bed" impedance.

Typically, a system of batteries is used to generate the required dc current continuously, and a second source of energy is used to re-charge the batteries. The second source of energy may, for example, by a gasoline or diesel engine and a generator or alternator, a thermoelectric generator, or it may be a solar energy photovoltaic converter. In the past, the most widely used solar energy converters used for remote power stations have employed a number of solar photovoltaic cells mounted to a fixed, planar frame, sometimes referred to as a "flat panel" construction. The flat panel was positioned in a well-known manner to enhance the collection of useful solar energy. It is known that if solar energy falls perpendicularly onto the surface of a solar cell, the energy conversion is at a maximum. The attitude and elevation of a solar flat panel in a fixed position for a given location on earth will provide a known maximum conversion of solar energy over the solar day throughout the year—that is, the number of generated watt hours per day.

However, the number of solar cells required on a fixed flat panel for a usable power station, considering the various positions of the sun throughout the year, is so large that the system has been prohibitably expensive for conventional commercial use. Further, the size of the system required the use of a heavy frame and support structures to provide adequate wind resistance. This further increased the cost of fabricating, installing and maintaining such systems. Exposure to the environment resulted in corrosion, the most frequent cause of system failure.

Thus, a very important aspect of a remote power station is its cost effectiveness—that is, the consideration of initial cost, installation cost, maintenance cost, fuel cost, life expectancy, etc. In a solar energy conversion system, the costs may be divided into three general areas. First, there is the necessary quantity of solar photovoltaic cells required to provide the watt-hours of electrical energy per unit of time (usually the average minimum number of hours of sunchine per day). Secondly, there is the cost of electrical or mechanical parts in the system other than the solar cells, and the production and installation costs. Finally, to be practical, the life expectancy of a solar energy system should be at least 20 years, and therefore, maintenance and repair/replacement costs should be considered as part of the initial design. A common failure of prior systems has been due to physical damage and corrosive effects of exposure to the natural elements of wind, rain, snow, hail, humidity, dust, etc. Prior methods of minimizing the effects of weather have proved either too costly or too ineffective for sustained commercial use.

Various forms of sun-tracking solar conversion systems have been designed which require high motor power; and for the reasons discussed, experienced other cost and reliability disadvantages similar to those associated with the flat panel design.

In the present invention, a number of solar energy converter assemblies are carried by a support frame which is mounted to a gimbal for independent rotation about a horizontal axis and a vertical axis. Separate drive motors are provided for elevation and azimuth control. Solar sensors detect the position of the sun; and control circuitry, responsive to the output signals of the sensors, actuates the drive motors to position the support frame in elevation and azimuth so that the converter assemblies track and face the sun whenever the sun incident energy is greater than a threshold level of about 25% of normal. Because of the ability to track the sun, the present invention has a number of significant advantages as compared to a conventional solar flat panel; among which is the fact that over a given day, it is able to produce more watt-hours of electrical power per unit of time for a given number of solar cells. Hence, the number of solar cells for given electrical requirements will be reduced significantly.

Further, each converter assembly includes a multiangular conical concentrator shell (i.e., formed from at least two frusto-conical elements placed in tandem) designed to collect, concentrate and direct incident solar energy onto the associated cell for conversion.

In this manner, the present invention overcomes many of the economic disadvantages of prior solar flat panel constructions be reducing the number of cells required, and by collecting and concentrating the incident energy onto the available cells. Assuming the same size cells with the same output rating are used, a typical reduction in the number of solar cells is about 85%; that is, only 13 to 15% of the number of solar cells is required for equivalent watt hour output.

The converter assemblies, the support frame and its gimbal mount, and the drive mechanism for the support frame are all located within an enclosed, stationary housing which is transparent to incident solar energy. That is to say, the housing is stationary, and the support frame is free to move within the housing to track the sun. Preferably, the housing is in the form of two flanged hemispherical transparent plastic members sealed and secured together. This feature has several important advantages. First, the support frame and gimbal mount structure for the converter assemblies may be made lighter because it does not have to resist wind forces, thereby simplifying the mechanical support requirements as well as substantially reducing the size and electrical power of the drive mechanisms. Secondly, the sealed enclosure keeps moisture, dust and other weather elements out of contact with the solar cells, the concentrators, the drive mechanisms, and other portions of the system which would otherwise deteriorate if exposed to the elements.

The present invention thus provides a solar energy converstion system which has a cost effectiveness which will permit it to be used commercially as a remote power station. Not only is the initial cost relatively low, but the system is reliable both electrically and mechanically, and the complete environmental protection afforded by a sealed enclosure increases reliability and life and reduces maintenance. The present system provides the solar energy converter assemblies in an electrically and mechanically modular form so that standard "modules", i.e., single self-contained system units or assemblies can be manufactured and connected in series, parallel or series-parallel circuit combinations whenever the user's total power requirements exceed the output capacity of any individual module.

Other features and advantages of the present invention will be apparent to persons skilled in the art from the following detailed description of a preferred embodiment accompanied by the attached drawing wherein identical reference numerals will refer to like parts in the various views.

THE DRAWING

FIG. 3 is a rear perspective view of the solar energy converter assemblies and support frame;

FIG. 4 is a cross sectional view of a solar energy converter assembly;

FIGS. 5, 6 and 7 are front, top and side views respectively of a gimbal yoke for the support frame of FIG. 3;

FIG. 8 is a cross sectional view of a biangular concentrator, illustrating the operation thereof.

DETAILED DESCRIPTION

Figure 1:
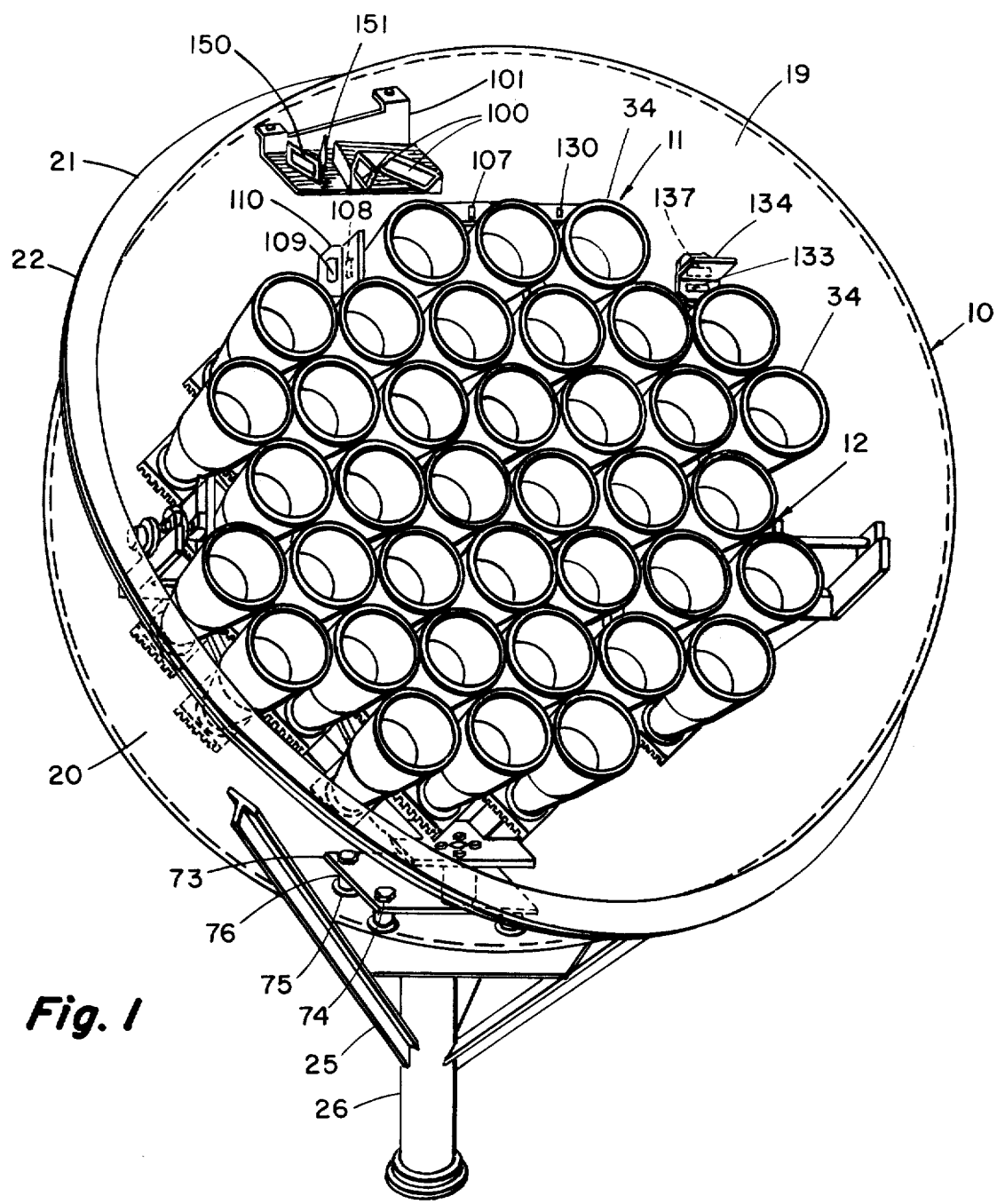
FIG. 1 is a perspective view of a solar energy conversion system constructed according to the present invention.

Referring first to FIG. 1, reference numeral 10 generally designates a spherical cover of transparent material. Mounted within the cover 10 are a plurality of solar energy converter assemblies generally designated 11. In the illustrated embodiment, there are 38 of the assemblies 11, and they are all mounted on a skeletal frame structure generally designated 12, and seen best in FIG. 3. The frame 12 is held by a gimbal or yoke generally designated 13 and seen best in FIGS. 5–7. The yoke 13 permits the frame 12 to rotate about a horizontal axis defined by the stud shafts 15, 16 so as to adjust the solar energy converter assemblies 11 in elevation. The converter assemblies 11 and frame 12, taken together, are sometimes referred to as a "solar panel" (schematically illustrated by block 80 in the system functional block diagram, FIG 2).

The yoke 13, in turn, is mounted for rotation about a vertically oriented shaft (see 18 in FIG. 7) for controlling the solar energy converter assemblies in azimuth.

The enclosure 10, in the illustrated embodiment, takes the form of first and second plastic hemispherical members 19, 20 which are each provided with a flange 21, 22, respectively. The hemispherical elements 19, 20 are secured together at the flanges 21, 22, and a sealing element or gasket is interposed between flanges 21, 22 so that when the enclosure 10 is thus assembled, all of the element within the enclosure are protected against wind, rain, snow, dust and other weather elements. The lower hemisphere 20 is mounted to a base or stand generally designated 25 which may include a pedestal 26 which is hollow for routing electrical wires, if desired.

The entire enclosure or housing 10 is preferably made of clear polycarbonate plastic, such as that sold under the trademark Lexan by the General Electric Company. Other materials may equally well be used, but they should transmit the rays of the sun without significant attenuation, be strong enough to resist wind for the size of the housing, and show little or no deterioration over long periods of exposure to sun and weather elements. The thickness of the enclosure 10 is not critical, and is determined primarily by the expected stress due to wind loading for the size required to house the number of solar energy converter assemblies being used. The exterior shape of enclosure 10 can also be shapes other than spherical. The determining factors are size, wind loading, and the economies of fabrication.

Referring now to FIG. 4, a solar energy conversion assembly 11 is seen in greater detail as comprising a conventional solar photovoltaic cell 30 which is mounted to a heat sink 31 including a plurality of fins 32 for carrying away heat generated at the cell 30. The photovoltaic cell 30 converts incident solar energy to an electrical potential, as is known. The assembly 11 also includes a biangular conical concentrator shell generally designated 34. In the illustrated embodiment, concentrator 34 includes first and second frustoconical members 36, 37 arranged in tandem. The base portion of the conical element 36 is provided with a peripheral flange 38 for mounting to the heat sink 31.

The inner surface of the concentrator 34 is made highly reflective with a "mirror-like" finish in order to have the maximum amount of the collected sun energy reach the active surface of the photovoltaic cell 30. Thus, the inner surface of the concentrator 34 may be plated with a highly reflective material, or it may be coated with a reflective film. The external surface of the concentrator 34 is either painted or anodized black, as is the exterior surface of the heat sink 32 so as to form a black body radiator to maintain the temperature of the cell 30 within acceptable limits. The conversion efficiency of the cell 30 is an inverse function of cell temperature.

The maximum increase in solar energy flux density—i.e., the concentrator area gain—is the ratio of the area of the collection window 41 in FIG. 8 to the area of the output aperture 41A. The gain of the concentrator is preferably greater than 6 to 1. Conventional photovoltaic cells have an output power characteristic which is not linear as a function of solar flux density. Therefore, engineering choices are required to be made in a particular system design. In one commercially available cell having a diameter of 2 ¼ in., a solar flux density of 100 milliwatts per square centimeter at a cell temperature of +28 C. will produce an output current of 500–600 milliamperes at 0.35 v. dc.

The design of the concentrator just described increases the cell output current to greater than three amperes at 0.35 v. dc.

In a preferred embodiment, the diameter of the circular collection window 41 is between six and seven inches and the diameter of the output aperture 41A is 2¼ in.

Referring now to FIG. 8, the angle that the conical side wall 36 defines relative to the axis or "boresight" of the concentrator 34 is preferably about 15 degrees, although it may be in the range of 13–17 degrees. Further, the angle that the conical side wall 37 defines relative to the axis of the concentrator is less than the angle "A" defined by the side wall 36, this latter angle being designated "B" and preferably being about 10° and desirably in the range of 9°–11°. Further, the axial length of the innermost conical section 36 is preferably longer than the axial length of the outer conical wall 37. The advantage of having a biangular conical concentrator of the type disclosed is illustrated in FIG. 8 wherein two incident parallel rays are designated respectively 39 (shown in solid line) and 40 (shown in dashed line). Both rays are at an angle of 10° from axis 42; which would be representative of "off axis" tracking of 10 degrees.

If the biangular conical construction were not present, and the inner conical wall 36 were extended to cover the same window (that is, have the same area of opening transverse of its axis for admitting rays), the ray 40 would strike dashed extension of the conical wall 36 at 40A, and be reflected, again striking at 40B and 40C. It will be observed that after reflecting at 40C, the ray has not been "captured" by the solar cell but will be reflected out of the concentrator and thus is lost energy and reduces concentrator achieved gain.

By having a biangular construction, it will be observed that the window, generally designated 41 is the same as for the hypothetical case just discussed. However, the ray 39 (which is parallel to the ray 40 but having a displacement further from the axis 42 of the concentrator), strikes the outermost portion of the conical wall 37 at 39A, is then reflected to strike the wall 36 at 39B, and thereafter falls onto the cell 30 (which is not shown in FIG. 8). If one defines concentrator efficiency as the ratio of energy collection window area to the solar cell watts output, it will be appreciated that the present collector, having a biangular conical construction, is a more "efficient" concentrator than a single-angle conical construction having the same capture window and with the maximum axial length being fixed.

For certain systems it may be desirable to use more than two frusto-conical walls to form the concentrator sheet; and hence, it is broadly described as "multiangular".

Returning now to FIG. 3, it will be seen that the frame 12 includes a pair of elongated angle irons 46, 47, joined together by a central frame element 48 and first and second side frame members 49, 50. The stub shafts 15, 16, are secured respectively to the side frame elements 49, 50. The support frame 12 also includes four radially-extending heavier frame members 51, 52, 53 and 54, which form an X-shape, and are secured to the frame members 46, 47. These members just described constitute the main supporting elements of the frame 12, which also includes a number of smaller frame elements such as those designated 55 and extending between the concentrators 34 for mounting the converter assemblies 11 to each other.

Referring now to FIGS. 5–7, the stub shaft 15 is provided wtih a gear 60 which is driven through a gear train 62 by an elevation drive motor 61.

The yoke 13 is mounted to a horizontal plate 65, to which the shaft mounting plate 65A is secured by four bolts. Shaft 18 is pinned to plate 65A. The shaft 18 is journaled in a housing 66 by means of bearings 67, 68, and its lower end is fitted with a gear 69. The gear 69 is driven via gear train 70 by an azimuth drive motor 71 in FIG. 7.

The azimuth drive motor 71 is mounted on a plate 73 which, in turn, is secured to the lowermost portion of the housing 10 by means of fasteners 74, washers 75, and grommets 76, as best seen in FIG. 1.

Figure 2:
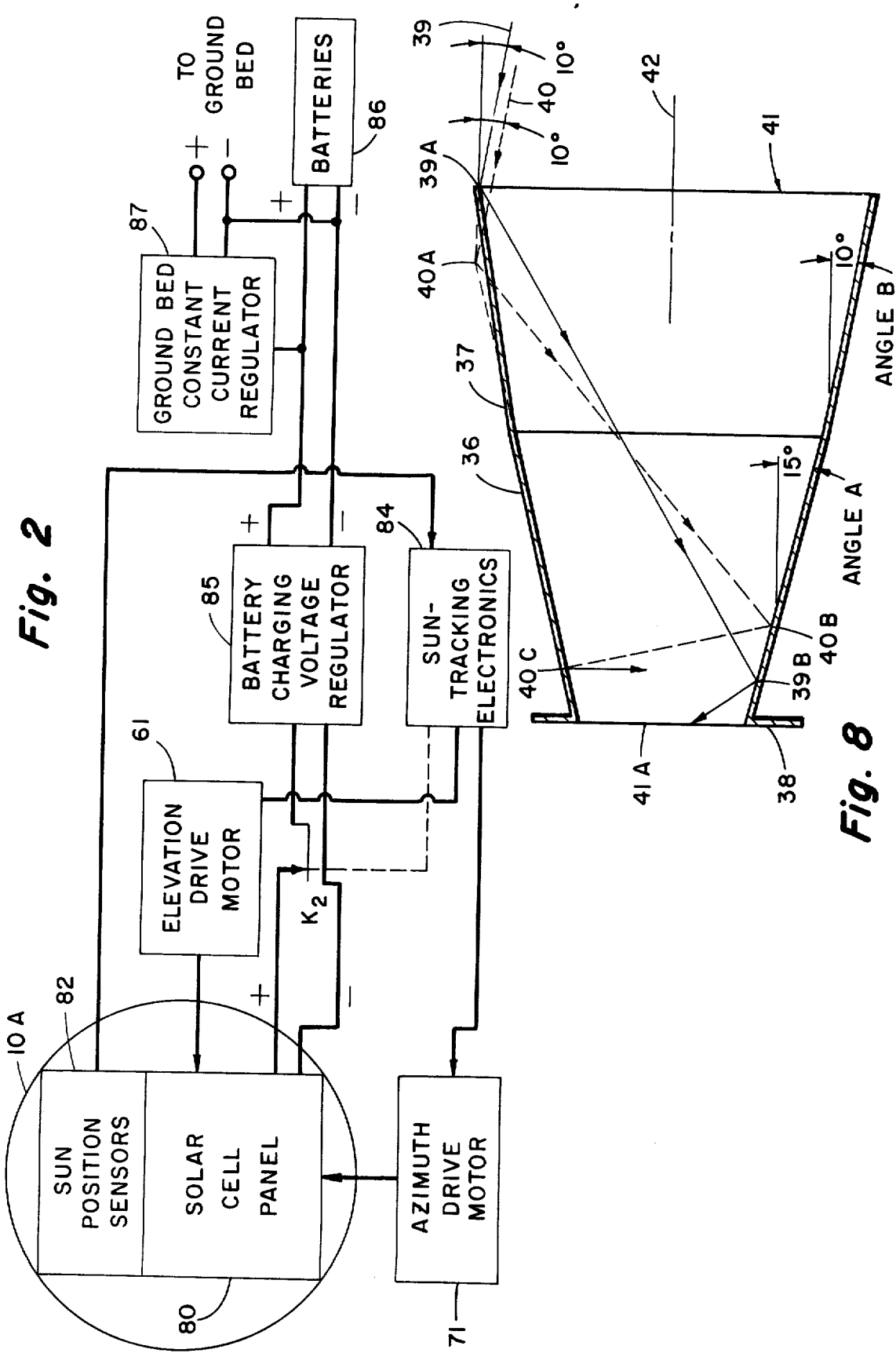
FIG. 2 is a functional block diagram of the control and conversion circuitry for the system of FIG. 1 for the commercial application of cathodic corrosion protection.

Referring now to FIG. 2, the housing or enclosure 10 is diagrammatically represented by the circle 10A; and within it is a solar cell panel 80 which comprises the solar energy converter assemblies 11 in frame 12. The elevation drive motor 61 positions the solar cell panel in elevation, and the azimuth drive motor 71 positions it in azimuth. Within the housing there are also fixed sun position sensors generally designated 82. Some of the sensors 82 generate signals indicating the position of the sun relative to the panel 80, and others are fixed relative to the housing 10 so as to indicate the position of the sun in its absolute sense. These signals are all coupled to the sun-tracking electronic circuitry, diagrammatically represented by the block 84 and to be discussed presently for energizing the elevation drive motor 61 and the azimuth drive motor 71.

At the same time, when the sun is available, a relay energizes contacts K2 so that the output of the solar cell panel 80 is coupled to a battery charging voltage regulator 85 which, in turn, is coupled to charge a bank of batteries diagrammatically represented at 86. As indicated above, the negative terminals of the batteries 86 is connected to the metal pipes to be protected. The positive terminal of the batteries 86 is connected to a ground bed constant current regulator 87, of conventional design, the output (positive terminal) of which is connected to a sacrificial electrode embedded in the ground.

SUN-TRACKING CIRCUITRY

Figure 9:
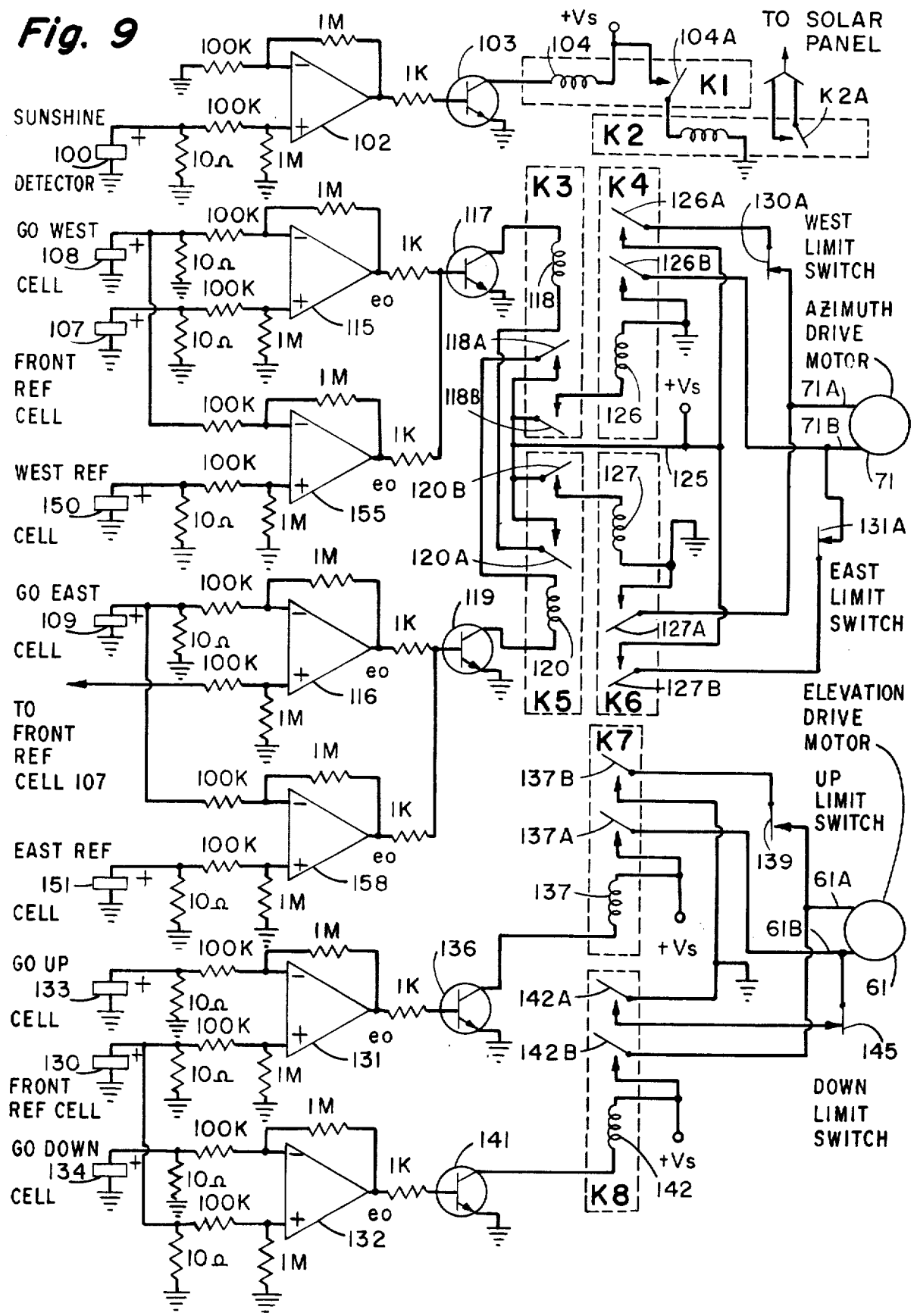
FIG. 9 is a circuit schematic diagram of sensing, control and drive circuitry for the sun-position sensing and tracking system.

Referring now to both FIGS. 1 and 9, there are a number of sensors (which may be solar cells) which serve various functions in the system.

Referring first to a pair of sensors 100, they are mounted on a bracket 101 which is secured to the inside of the enclosure 10. The sensors 100 generally face outwardly and in slightly opposing directions. The function of sensors 100 is to detect the presence of sunshine. Referring now to FIG. 9, the sensors 100 are represented as a single sensor since they are connected in parallel. The positive terminal is connected to the positive input terminal of an operational amplifier 102, the negative input terminal of which is referenced to ground. Thus, when the output signal of the "Sunshine" detectors 100, is of sufficient magnitude, the output of amplifier 102 will go positive and cause a transistor 103 to conduct. The coil 104 of a relay K1 is connected in the collector circuit of transistor 103, and will thereupon be energized. When the coil 104 is energized, contacts 104A close, thereby energizing the coil of a second relay K2. Relay K2 includes the contacts K2A which, as seen in FIG. 2, couple the output of the solar cell panel 80 to the battery-charging voltage regulator 85, as discussed. Thus, the sensors 100 detect the presence of sunshine for coupling the output of the energy converters to the battery charging circuitry. This prevents the battery-charging circuitry from discharging into the solar cells during periods of darkness.

The azimuth drive motor 71 is controlled by the cooperative action of a reference sensor 107 which is mounted on the support frame 12 for the solar energy converter assemblies 11, and a pair of sensors 108 and 109, also secured to the frame 12. The sensors 108, 109 are generally parallel to the surfaces of the solar cells, as is the reference sensor 107. The sensors 108, 109 are separated by a wall member 110. Assuming that the observer in FIG. 1 is standing slightly south of the system, the sensor 108 is referred to as the "Go West" sensor, and the sensor 109 is referred to as the "Go East" sensor. The function of these sensors is to actuate the azimuth drive motor 71 so that it will move the panel respectively in a westerly or easterly direction depending upon the location of the sun. This is accomplished by the circuitry in FIG. 9. The anode of the reference sensor 107 is connected to the positive input terminals of a first operational amplifier 115 and a second operational amplifier 116. The anode of the "Go West" sensor 108 is connected to the negative input of the amplifier 115, and the anode of the "Go East" sensor 109 is connected to the negative input of the amplifier 116. The output of amplifier 115 is connected to the base of a transistor 117, in the collector circuit of which there is connected the coil 118 of a relay K3. Similarly, the output of amplifier 116 is connected to the base of a transistor 119, whose collector circuit contains a coil 120 of a relay K5.

The relay K3 includes first normally closed and second normally open contacts 118A and 118B respectively. Similarly, the relay K5 includes first normally closed and second normally open contacts 120A and 120B. A positive supply voltage $V_s$ from batteries 86 is connected to a terminal 125. The contacts 118A are connected in series between the source $V_s$ and the coil 120 of relay K5. The contacts 118B are connected in series between the source $V_s$ and a coil 126 of a relay K4. The relay K4 includes first and second pairs of normally open contacts 126A and 126B. The contacts 120A are connected in series between the source $V_s$ and the coil 118 of relay K3; and the contacts 120B are connected in series between the source $V_s$ and a coil 127 of a relay K6, having first and second pairs of normally open contacts 127A and 127B.

The contacts 126A are connected in series between the source $V_s$, and a normally closed West Limit Switch 130, the other terminal of which is connected to an input terminal 71A of the azimuth drive motor 71. The contacts 127B are connected in series between the source $V_s$ and a normally closed East Limit Switch 131, the other terminal of which is connected to input terminal 71B of the azimuth drive motor 71.

The terminal 71A of the azimuth drive motor 71 is connected in series with the contacts 127A and ground; similarly, the terminal 71B is connected in series with the contacts 126B and ground.

The spacing of the detectors 108, 109 relative to the wall 110, and the height of the wall 110 together with the sensitivity of the circuitry determine the azimuth tracking accuracy. The tracking accuracy, in turn, should be related to the desired accuracy with respect to the sun position of the boresight angle of the concentrators 34 for the individual solar energy conversion assemblies 11.

In operation of the circuitry just described, the output of sensor 108 is less than the output of the reference sensor 107 whenever the azimuth boresight of the concentrator 34 is pointing east of the sun's position; and the output of sensor 109 is less than the output of the reference sensor 107 whenever the concentrator is pointing west of the sun's position.

Further, because the voltage generated by these cells is similar to all solar cells (i.e., it is a function of incident solar energy) and it takes a certain amount of voltage (which is the differential voltage between the input cells) to energize amplifier 115, the amplifier will not operate unless the incident energy is above a threshold value. This value is preferably set at about 25% of the normal expected energy level.

Let it be assumed that the operating threshold is exceeded and the position of the platform is such that the output voltage of the "Go West" sensor 108 is less than that of the reference sensor 107. In this condition, the signal on the positive input terminal of amplifier 115 will be greater than that on its negative input terminal by the required threshold and thereby generate a positive output signal which will cause the transistor 117 to conduct. At the same time, because of the position of the sun and the direction in which the solar panel 80 is facing, the output signal of the "Go East" cell 109 will be equal to or greater than the output of the reference cell 107, and the output of amplifier 116 will be negative, so that transistor 119 will remain in a non-conducting state.

With transistor 117 conducting, the coil 118 of relay K3 is energized through the normally closed contacts 120A of relay K5. When this occurs, the contacts 118A open to insure that relay K5 will not become energized, and contacts 118B close to energize the coil 126 of relay K4. When the coil 126 is energized, contacts 126A and 126B close, and the azimuth drive motor 71 is energized in a first direction to cause the solar panel 80 to travel in a westerly direction. This movement will continue until the panel travels either to its west limit position, at which time the switch 130 will open to de-energize the motor 71, or until such time as the "Go West" sensor 108 "sees" the sun (i.e., the boresight tracking position of 34 has been reestablished), thereby causing the output of amplifier 115 to go negative which in turn causes 117 to be cut off and de-energizing relay K3. If the sun were in an easterly position, and the platform facing West, the circuitry associated with amplifier 116 would energize the motor 71 in the opposite polarity to cause the platform to be rotated easterly in azimuth, provided again that the desired operating threshold is exceeded.

Similar circuitry is used to energize the elevation drive motor 61, seen at the lower right-hand portion of FIG. 9. Specifically, referring to FIG. 1, reference numeral 130 denotes an elevation reference sensor cell, the output of which feeds the positive input terminals of amplifiers 131 and 132. The negative input signal of amplifier 131 is received from the "Go Up" sensor 133, and the negative input signal of amplifier 132 is received from the "Go Down" sensor 134. The sensors 133, 134, are mounted on a base 136 which is mounted to the frame 12 of the solar panel 80 and these two sensors are separated by a partial wall element 137 which extends in the east-west direction and in a plane perpendicular to the plane of the solar power conversion cells 30.

The output of the amplifier 131 is connected to the base of a transistor 136, the collector of which is connected to a coil 137 of a relay K7. The relay K7 includes a pair of normally-open contacts 137A and 137B. The contacts 137A are connected between the source $V_s$ and input terminal 61B of the elevation drive motor 61. Contacts 137B are connected between ground, and input terminal 61A of the motor 61 by means of an "up" limit switch 139.

The output of amplifier 132 is connected to the base of the transistor 141, the collector of which is connected to a coil 142 of relay K8. The relay K8 also includes first and second sets of normally open contacts 142A and 142B. The contacts 142A are connected in series between ground and a "Down" limit switch 145, and the terminal 61B of motor 61. The contacts 142B are connected in series between the source $V_s$ and the terminal 61A of the elevation drive motor 61. The operation of the circuitry to control the elevation of the solar cell panel 80 by controlling the direction of rotation of the motor 61 is similar to that which has been described in connection with the control of the azimuth drive motor 71.

Additional circuitry is included for properly orienting the solar cell panel 80 when it may be facing 90° or more from the sun's position. Such a condition might occur when the sun rises in the East and the solar cell platform is facing West, having ended operation at the termination of the previous day. This condition can also arise if the solar cell panel 80 is facing East in the morning, and the sun does not reach a useful level until later in the day, having been obscured, perhaps, by a storm.

In order to provide for operation under these conditions, a sensor cell 151 is mounted on the bracket 101 and facing in an easterly direction, and a similar cell 150 is located to face a westerly direction. The output of cell 150 is fed to the positive input terminal of an operational amplifier 155, the output of which is connected to the base of a transistor 117. The circuit is such that if the output of either amplifier 115 or amplifier 155 is positive, transistor 117 will conduct.

The negative input terminal of amplifier 155 is connected to the output of the "Go West" cell 108. Similarly, the output of the East Reference cell 151 is connected to the positve input of an amplifier 158, the output of which is connected to the base of transistor 119. Transistor 119 is also operated by either amplifier 116 or amplifier 158. The negative input terminal of amplifier 158 is connected to the "Go East" sensor 109. Thus, amplifier 155 compares the outputs of the "Go West" cell 108 with the "West Reference" sensor 150. If the output of sensor 150 is more than the output of sensor 108, this is an indication that the solar platform is facing East and the sun is in the West. In this situation, the output of amplifier 155 is positive to cause the transistor 117 to conduct, and as previously described, this causes the azimuth drive motor 71 to swing the solar panel 80 to the West. Similarly, if the output of the "East Reference" sensor 151 is more than the output of the "Go East" sensor 109, the motor 71 will be energized in the opposite polarity to cause the solar panel 80 to rotate to the East until the output signals of these two cells are equalized, at which time transistor 119 will cease to conduct.

The present invention, in summary, provides a system wherein a panel of solar energy converter assemblies is mounted for independent rotation about horizontal and vertical axes so that it can track the sun in its movement. This maximizes the utility of the system by insuring that the radiation from the sun is substantially perpendicular to the plane of the solar cell. For a given system watt-hour output requirement, the number of solar cells is at a minimum.

Further, by enclosing the solar cells and their support frame, together with the driving mechanism within an enclosure, failures and deterioration associated with a corrosive environment and weather are reduced to substantially increase the useful life of the system and enhance its reliability. Such enclosure is accomplished at a reasonable cost without reducing the performance of the system.

By eliminating the effect of wind loading on the major elements of the system, the supporting structure for the solar panel can be made light in weight, thereby reducing the torque and power requirements of the drive motors. This further reduces the drain on the primary batteries in the system. All of these advantages reduce the cost of all system components and increase system life and reliability.

By using a multi-angular conical concentrator, the output of the individual cells is increased substantially and the number of cells required for a given watt-hour requirement is even further reduced. Finally, as has been indicated, the tracking system disclosed cooperates with the concentrators to insure that the boresight of the individual solar energy converter assemblies is within the required angular tolerance of the sun's position such that the solar cell power output is continually maximized to the system design requirement.

Having thus described in detail a preferred embodiment of the invention, persons skilled in the art will be able to modify certain of the structure which has been illustrated and to substitute equivalent elements for those disclosed while continuing to practice the principle of the invention, and it is, therefore, intended that all such modifications and substitutions be covered as they are embraced within the spirit and scope of the appended claims.

I claim:

1. Apparatus comprising a frame; a plurality of solar energy converter means mounted on said frame to form a solar panel for converting solar energy to another form of energy each of said solar energy converter means including a photovoltaic cell, heat exchanger means in heat transfer communication with said cell, and an energy concentrator having a collection window and an outlet aperture adjacent said cell, said concentrator having a gain of at least 6 to 1 and an interior reflective surface; a biangular conical shell having a first frustoconical wall extending from said cell to an intermediate location and defining a first angle relative to the boresight of said concentrator and a second frustoconical wall extending from said intermediate position to said collection window and defining a second angle relative to said boresight, said second angle being smaller than said first angle; support means for mounting said frame and said solar panel for independent motion about first and second axes; drive means for independently positioning said frame and said solar panel relative to said support means about said axes; control circuit means including sun sensor means for energizing said drive means to position said solar panel to face the sun; housing means of a material permitting transmission of solar energy substantially throughout its entire surface area and enclosing said solar panel, support means and drive means; and base means attached to said housing for rigidly supporting the same, whereby incident wind forces are transmitted from said housing directly to said base and not to said panel and support means.

2. The apparatus of claim 1 wherein said support means comprises gimbal mounting means supporting said frame for rotation about said first axis, and support means for said gimbal mounting means for rotating said gimbal mounting means about said second axis transverse of said first axis.

3. The apparatus of claim 1 wherein said housing comprises a closed, sealed housing of polycarbonate plastic material.

4. The apparatus of claim 3 wherein said housing comprises first and second hemisphere elements of polycarbonate plastic, at least one hemisphere element including flange means, said system further comprising means for connecting said elements together at said flange means, and sealing means interposed between said flange means of one element and the other element.

5. The apparatus of claim 1 wherein said first angle of said concentrator is approximately 15° and said second angle is approximately 10°.

6. In combination with a solar panel comprising a plurality of solar cell conversion means rigidly secured together, and reversible drive means for rotating said panel about a predetermined axis; sun tracking circuit means comprising: reference sensor means responsive to solar energy for generating a reference signal in response to incident solar energy; opaque wall means extending in a plane parallel to said axis; first and second detecting sensor means, one on each side of said wall means for generating respectively second and third signals representative of incident solar radiation; first circuit means responsive to said reference signal and said second signal for energizing said drive means in one direction to rotate said panel about said axis toward the sun when the sun in on one side of said wall means; and second circuit means responsive to said reference signal and said third signal for energizing said drive means in a second direction to rotate said panel about said axis toward the sun when the sun is on the other side of said wall means.

7. The apparatus of claim 6 comprising a second reversible drive means for rotating said panel about a second axis transverse of said first axis, said system further including second sun tracking circuit means comprising a second sensor means responsive to solar energy for generating a second reference signal in response to incident solar energy, a second opaque wall means extending in a second plane parallel to said second axis; third and fourth detecting sensor means, one on either side of said second wall means for generating respectively fourth and fifth signals representative of incident solar radiation, second circuit means responsive to said second reference signal and said fourth signal for energizing said second drive means in one direction to rotate said panel about said second axis toward the sun when the sun is on one side of said second wall means, and fourth circuit means responsive to said second reference signal and said fifth signal for energizing said second drive means in a second direction to rotate said panel about said second axis toward the sun when the sun is on the other side of said second wall means.

8. The apparatus of claim 6 wherein each of said conversion means further comprises a concentrator shell having a collection window and an outlet aperture adjacent an associated cell, said collection window being larger than said output aperture.

9. The apparatus of claim 6 wherein each of said first and second circuit means includes threshold circuit means responsive to signals exceeding predetermined thresholds, said thresholds being such that said tracking circuit means is inoperative until the solar energy level attains at least about 25% of normal.

* * * * *